(12) United States Patent
Kuo et al.

(10) Patent No.: US 8,164,878 B2
(45) Date of Patent: Apr. 24, 2012

(54) POWER DISTRIBUTION UNIT

(75) Inventors: Heng-Chen Kuo, Taipei Hsien (TW); Yang-Yuan Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 215 days.

(21) Appl. No.: 12/764,073

(22) Filed: Apr. 20, 2010

(65) Prior Publication Data
US 2011/0228430 A1    Sep. 22, 2011

(30) Foreign Application Priority Data
Mar. 18, 2010    (TW) ................................ 99108074 A

(51) Int. Cl.
*H02H 1/00*    (2006.01)
(52) U.S. Cl. ........................................ 361/119; 361/117

(58) Field of Classification Search .......... 361/117–120; 324/551, 555
See application file for complete search history.

(56) References Cited

U.S. PATENT DOCUMENTS
5,323,289 A * 6/1994 Longsdorf et al. ............ 361/111
6,815,956 B2 * 11/2004 Weldin et al. .................. 324/536
* cited by examiner

*Primary Examiner* — Danny Nguyen
(74) *Attorney, Agent, or Firm* — Altis Law Group, Inc.

(57) ABSTRACT

A power distribution unit includes a communication unit. The communication unit includes a communication port and a protection circuit. The communication unit includes a ground pin and a plurality of signal pins. The ground pin is connected to a digital ground of the power distribution unit. The signal pins are connected together to receive a voltage signal outputted by a hi-pot tester. The protection circuit includes a plurality of resistors connected between the signal pins and an analog ground of the power distribution unit.

11 Claims, 2 Drawing Sheets

POWER DISTRIBUTION UNIT

BACKGROUND

1. Technical Field

The present disclosure relates to power distribution units, and particularly to, a power distribution unit having a protection circuit.

2. Description of Related Art

Power distribution units commonly divide incoming power into a number of branch circuits. The branch circuits supply power to various equipment, such as servers, routers, hubs, and so on. A power distribution unit usually comes equipped with a communication unit. Therefore, control signals can be transmitted to the power distribution unit via the communication unit. In another aspect, information of the power distribution unit can be transmitted to a monitoring apparatus via the communication unit.

Power distribution units are usually tested under high voltage. During testing, however, the communication units may be damaged due to the high voltages.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
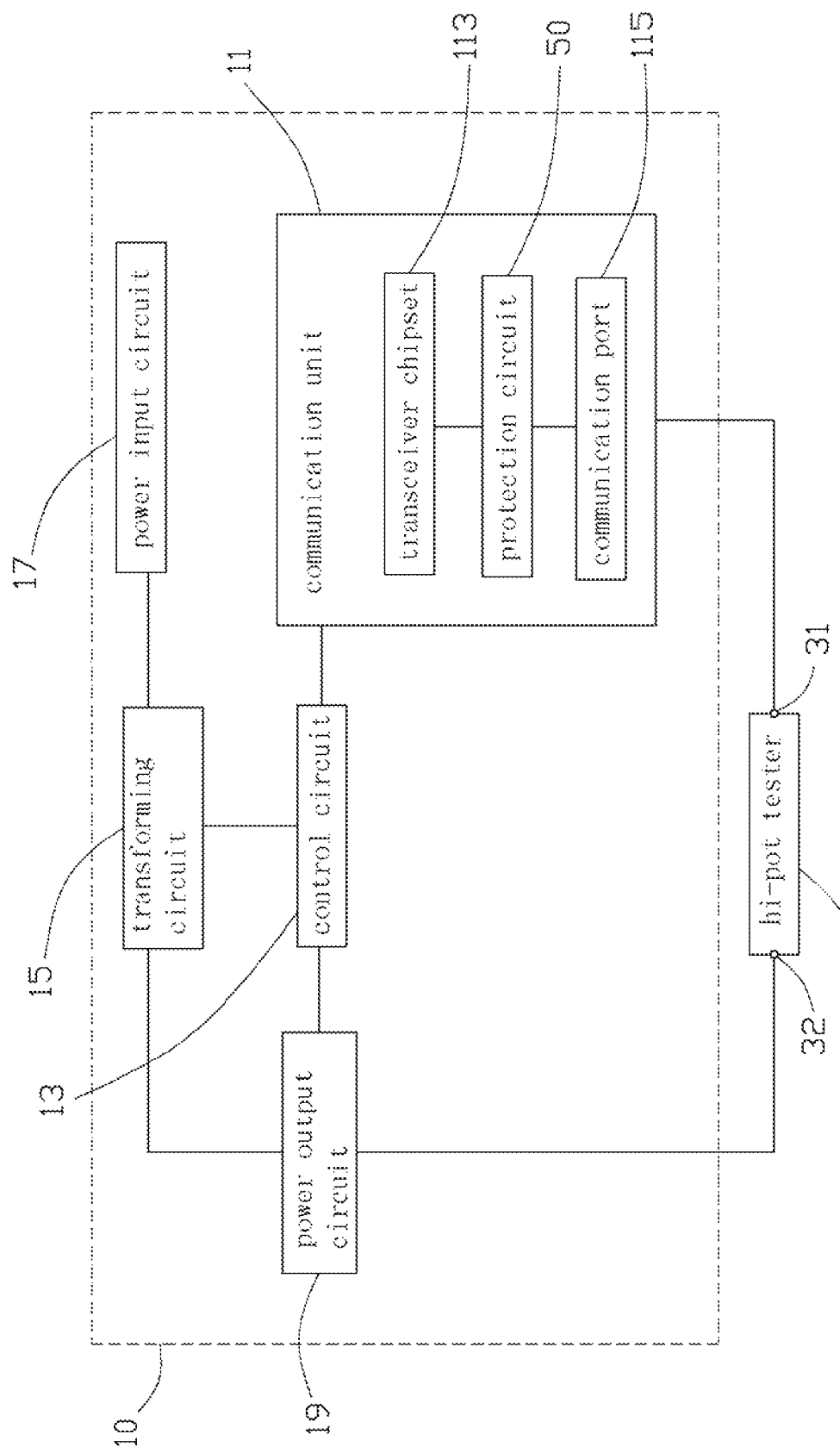
FIG. 1 is a block view of a power distribution unit of one embodiment.

Referring to FIG. 1, a power distribution unit 10 in accordance with an embodiment of the present disclosure includes a communication unit 11, a control circuit 13, a transforming circuit 15, a power input circuit 17, and a power output circuit 19. The communication unit 11 is connected to the control circuit 13. The transforming circuit 15 and the power output circuit 19 are connected to the control circuit 13. The power input circuit 17 is connected to the transforming circuit 15. The power output circuit 19 is also connected to the transforming circuit 15. The transforming circuit 15 receives power from the power input circuit 17, transforms the received power, and transmits the transformed power to the power output circuit 19.

The communication unit 11 includes a transceiver chipset 113, a communication port 115, and a protection circuit 50 connected between the transceiver chipset 113 and the communication port 115.

Figure 2:
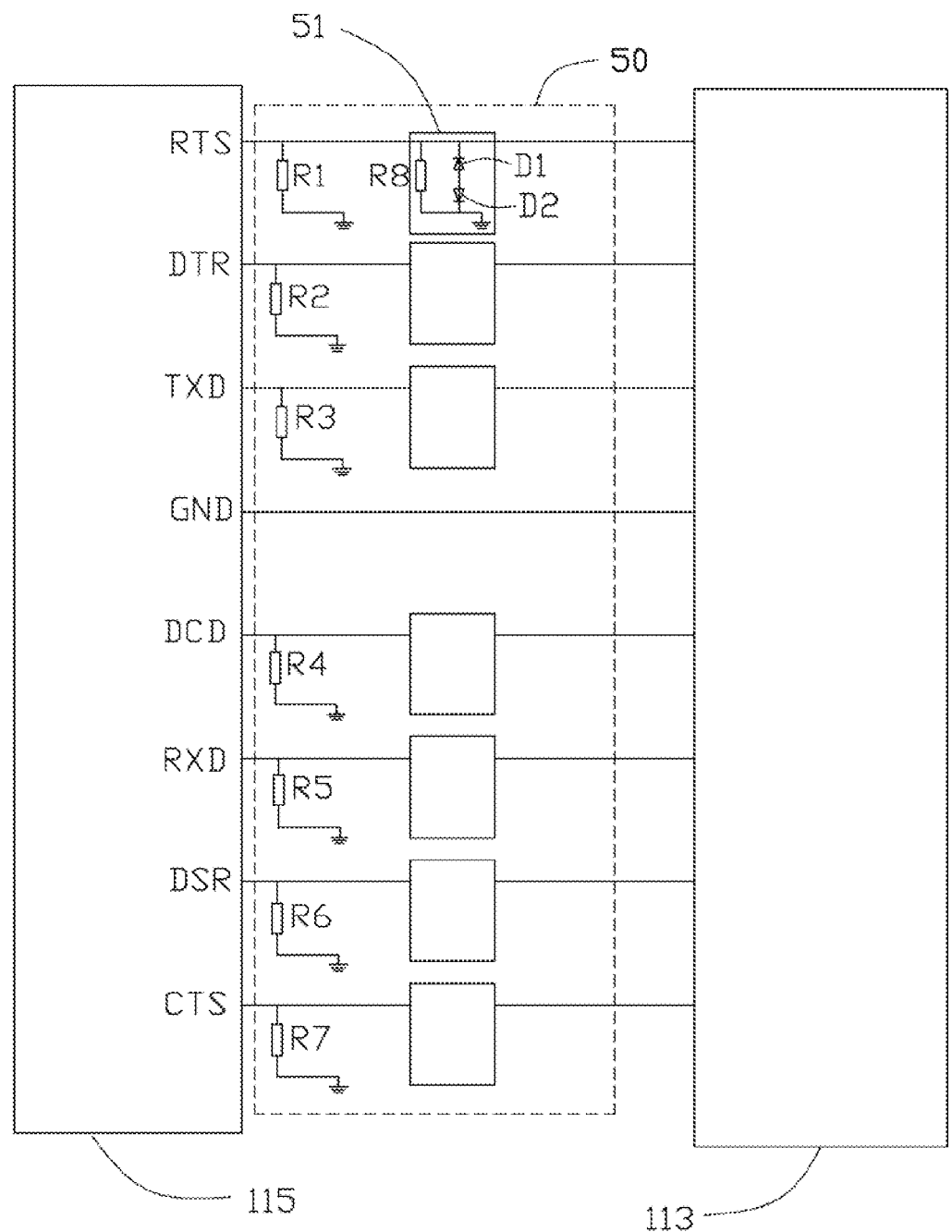
FIG. 2 is a circuit diagram of a communication unit of the power distribution unit of FIG. 1.

Referring to FIGS. 1 and 2, in one embodiment, the communication port 115 includes a ground pin GND, and six signal pins RTS, DTR, TXD, DCD, RXD, DSR and CTS. The ground pin GND is connected to a digital ground of the power distribution unit 10.

The protection circuit 50 includes resistors R1, R2, R3, R4, R5, R6, R7, and seven linkage circuits 51. Each of the signal pins RTS, DTR, TXD, DCD, RXD, DSR and CTS of the communication port 115 is connected to analog ground of the power distribution unit 10 via one of the resistors R1, R2, R3, R4, R5, R6, or R7. Further, each of the signal pins RTS, DTR, TXD, DCD, RXD, DSR and CTS of the communication port 115 is connected to the transceiver chipset 113 via the linkage circuit 51. Each linkage circuit 51 includes a resistor R8, and two diodes D1 and D2. Anodes of the diodes D1 and D2 are connected together. Cathodes of the diodes D1 are each connected to a corresponding signal pin of the communication port 115. Cathodes of the diodes D2 are each connected to the digital ground of the power distribution unit 10. Each of the signal pins of the communication port 15 is connected to the digital ground via the resistor R8 of the corresponding linkage circuit 51.

When the power distribution unit 10 is under test, the signal pins of the communication port 115 are combined and connected together, and connect to an output end 31 of a hi-pot tester 30. An input end 32 of the hi-pot tester 30 is connected to the power output circuit 19 of the power distribution unit 10. The output end 31 of the hi-pot tester 30 outputs a voltage signal to the power distribution unit 10 via the signal pins of the communication port 15. The input end 32 of the hi-pot tester 30 receives a feedback signal from the power output circuit 19 to determine whether the test is passed.

During the test, the voltage signal received by the signal pins of the communication port 15 is connected to the analog ground via the resistors R1 to R7, and the voltage signal is connected to the digital ground by the linkage circuits 51. Therefore, the communication port 15 is protected from being damaged by the voltage signal.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A power distribution unit, comprising:
a communication unit which comprising a communication port and a protection circuit, the communication unit comprising a ground pin and a plurality of signal pins, the ground pin connected to a digital ground of the power distribution unit, the signal pins connected together to receive a voltage signal outputted by a hi-pot tester, the protection circuit comprising a plurality of resistors connected between the signal pins and an analog ground of the power distribution unit.

2. The power distribution unit of claim 1, wherein the communication unit comprises a transceiver chipset, the protection circuit comprising a plurality of linkage circuits, each of the signal pins is connected to the transceiver chipset via a linkage circuit.

3. The power distribution unit of claim 2, wherein each linkage circuit comprises a second resistor connected between the corresponding signal pin and a digital ground of the power distribution unit.

4. The power distribution unit of claim 3, wherein each linkage circuit further comprises a first diode and a second diode, anodes of the first and second diodes are connected together, a cathode of the first diodes is connected to corresponding signal pin of the communication port, and a cathode of the second diodes is connected to the digital ground of the power distribution unit.

5. The power distribution unit of claim 1, further comprising a power output circuit connected to the hi-pot tester and outputting a feedback signal to the hi-pot tester.

6. A power distribution unit, comprising:
 a communication port which comprises at least one signal pin, the at least one signal pin receiving a voltage signal outputted by a hi-pot tester; and
 a protection circuit comprising at least one resistor connected between the at least one signal pin and an analog ground of the power distribution unit, the protection circuit further comprising at least one linkage circuit connected between the at least one signal pin and a digital ground of the power distribution unit.

7. The power distribution unit of claim 6, further comprising a transceiver chipset, wherein the at least one signal pin is connected to the transceiver chipset according to the at least one linkage circuit.

8. The power distribution unit of claim 6, wherein the at least one linkage circuit comprises a second resistor connected between the at least signal pin and the digital ground of the power distribution unit.

9. The power distribution unit of claim 8, wherein the at least one linkage circuit further comprises a first diode and a second diode, anodes of the first and second diodes are connected together, a cathode of the first diodes is connected to the at least one signal pin of the communication port, and a cathode of the second diodes is connected to the digital ground of the power distribution unit.

10. The power distribution unit of claim 6, further comprising a power output circuit connected to the hi-pot tester and outputting a feedback signal to the hi-pot tester.

11. The power distribution unit of claim 6, wherein the communication port further comprises a ground pin, and the ground pin is connected to a digital ground of the power distribution unit.

\* \* \* \* \*